Figure 1:
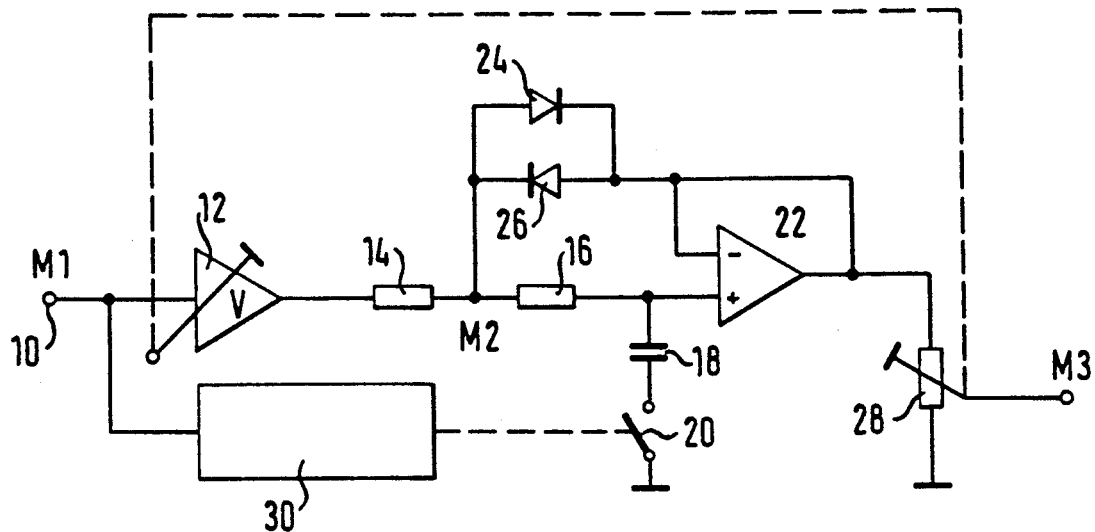

United States Patent

Brinkhaus

[11] Patent Number: 5,212,829
[45] Date of Patent: May 18, 1993

[54] CIRCUIT ARRANGEMENT FOR SUPPRESSION OF INTERFERENCE SIGNALS

[75] Inventor: Stefan Brinkhaus, Remchingen-Wilferdingen, Fed. Rep. of Germany

[73] Assignee: Becker Autoradiowerk GmbH, Karlsbad, Fed. Rep. of Germany

[21] Appl. No.: 836,351

[22] Filed: Feb. 18, 1992

[30] Foreign Application Priority Data

Feb. 19, 1991 [DE] Fed. Rep. of Germany ....... 4105123

[51] Int. Cl.$^5$ .......................... H04B 1/10; H04B 1/26; H03B 5/04
[52] U.S. Cl. .................................. 455/296; 455/307; 455/308; 307/521; 328/127
[58] Field of Search ............... 455/296, 297, 307, 308; 375/99, 102.3; 307/520, 521, 540, 542, 543, 545, 546; 328/127, 128, 165, 167

[56] References Cited

U.S. PATENT DOCUMENTS

| 4,204,170 | 5/1980 | Kage | 328/165 |
| 4,419,541 | 12/1983 | Rhode | 381/7 |
| 4,571,548 | 2/1986 | Jordan | 455/308 |
| 4,742,570 | 5/1988 | Ichikawa | 455/312 |
| 4,899,389 | 2/1990 | Amazawa | 455/297 |

FOREIGN PATENT DOCUMENTS

| 0089853 | 9/1983 | European Pat. Off. . |
| 2534310 | 2/1976 | Fed. Rep. of Germany . |
| 2352855 | 4/1979 | Fed. Rep. of Germany . |
| 2915105 | 10/1979 | Fed. Rep. of Germany . |
| 2029177 | 3/1980 | United Kingdom . |

OTHER PUBLICATIONS

"Understanding and Handling Noise", HF Communications Receivers: Theory and Design, U. Rohde, Nov. 1986, pp. 10-22.

Primary Examiner—Reinhard J. Eisenzopf
Assistant Examiner—P. Sobutka
Attorney, Agent, or Firm—Sixbey, Friedman, Leedom & Ferguson

[57] ABSTRACT

For suppressing interference signals in a multiplex signal an RC member which is preceded by a voltage divider is used. The voltage divider consists of a resistor and two diodes which are connected in parallel and in opposite directions and which perform a limitation with respect to a reference signal taken from the output of a fedback differential amplifier. The output signal of the RC member is applied to the non-inverting input of the differential amplifier. The limitation is carried out with respect to a reference signal corresponding to the signal smoothed by the RC member.

8 Claims, 2 Drawing Sheets a)  M1 b)  M2 c)  M3

CIRCUIT ARRANGEMENT FOR SUPPRESSION OF INTERFERENCE SIGNALS

The invention relates to a circuit arrangement for suppression of interference signals in a signal containing LF information comprising an integrating RC member lying in the signal path.

In an electrical signal containing low-frequency or audio-frequency information, for example a voice or music signal, interference signals can occur which are due to various causes. As a particular example of use, in the following description a radio receiver will be considered, in particular a radio receiver for mobile operation, for example an automobile radio. The multiplex signal withdrawn behind the demodulator of the receiving section contains of course the sum and the difference signal of the two stereo channels, the pilot reference and further identification signals. In addition, interference signals occur which are caused not only by various electromagnetic interference sources but also by reception interferences such as multipath reception. The interference signals are pulse-like and often of very short duration, corresponding to a high frequency compared with the AF or LF range.

To suppress these interference signals, various methods of varying degrees of complication can be adopted. The probably simplest method resides in arranging an RC member with integrating behaviour in the signal path. Although by such an RC member the pulse peaks of the interference signals are reduced in their amplitude, the duration of the interference pulses is increased by the integrating behaviour of the RC member. However, an increase in the duration of the interference signal pulses can lead to frequency components which lie in the AF range so that the result is rather a deterioration of the subjective hearing impression.

It is further possible to blank out interference signal pulses and to bridge the AF signal during the blank-out periods. However, if it is to obtain good results this method requires a considerable technical expenditure.

The problem underlying the invention is to make available a circuit arrangement for suppression of interference signals which is distinguished by high effectiveness with minimum expenditure.

This problem is solved according to the invention in a circuit arrangement of the type mentioned at the beginning in that in front of the RC member in the signal path a voltage divider is arranged which contains a nonlinear element and performs a limitation with respect to a reference signal which corresponds to the signal smoothed by the RC member. By this step the amplitude of the interference pulses is limited to a value which is related to the particular instantaneous amplitude of the smoothed signal behind the RC member. In front of the RC member the instantaneous amplitude of the signal therefore lies within a limited range above and below the instantaneous amplitude of the smoothed signal. The interference pulses now smoothed by the RC member are of limited height so that the integration effect cannot lead to the generation of interfering signal components which would lie within the audible LF range.

The limitation with respect to a reference signal corresponding to the signal smoothed by the RC member can be implemented with very simple means. If an impedance converter, preferably a fedback differential amplifier, is arranged after the RC member the output of said impedance converter furnishes the reference signal. Two diodes connected antiparallel are connected with one terminal to the output of the impedance converter and the other terminal of the diode pair is connected to the input of the RC member which is preceded by a load resistance of the voltage divider. The diodes form the nonlinear element of the voltage divider.

When the circuit arrangement is applied to the multiplex signal of a radio receiver the presence of the RC member in the signal path results in the upper limit frequency of the signal being reduced. Under these circumstances stereo reception is impossible or possible only to a limited extent. Consequently, in accordance with a preferred embodiment the capacitor of the RC member is connected and disconnected via a switch; the switch is controlled by an interference detector with analyses the electrical signal and detects interferences immediately after their occurrence. The circuit is therefore open in the usual case and is temporarily closed only on occurrence of interference pulses. Alternatively, instead of a switch a variable resistor can be employed, the resistance of which is controllable by a quality rating signal, the level of which is a function of the interference signal component in the electrical signal. When the RC member is inoperative the reference signal is completely identical to the original electrical signal; the electrical signal passes through the circuit arrangement without any loss of quality. In contrast, when the capacitor is connected interference signal suppression takes place, the effect of which can be optimized in accordance with the subjective hearing sensation by dimensioning of the RC member and suitable choice of the level at which the limitation by the nonlinear element starts.

A simple possibility of determining the point at which the limitation by the nonlinear element takes place resides in that in front of the voltage divider an amplifier is connected, the gain factor of which can be adapted to the characteristics of the diodes employed. A simple possibility of corresponding influencing resides in the selection of diodes of suitable threshold voltage. Finally, it is also possible with relatively simple circuit steps to apply a bias to the diodes to shift their threshold value relatively to the level of the reference signal.

Figure 2:
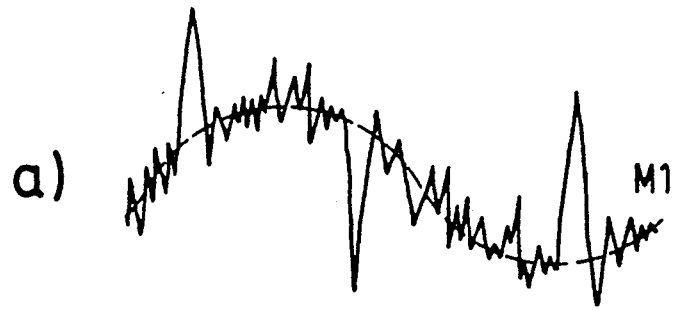
Figure 2:
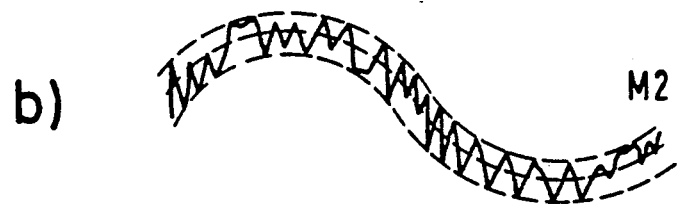
Figure 2:
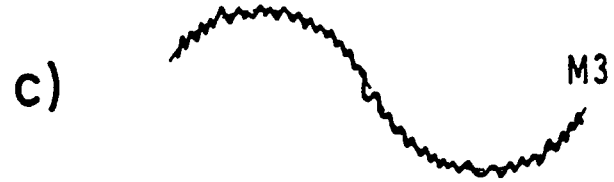
Figure 3:
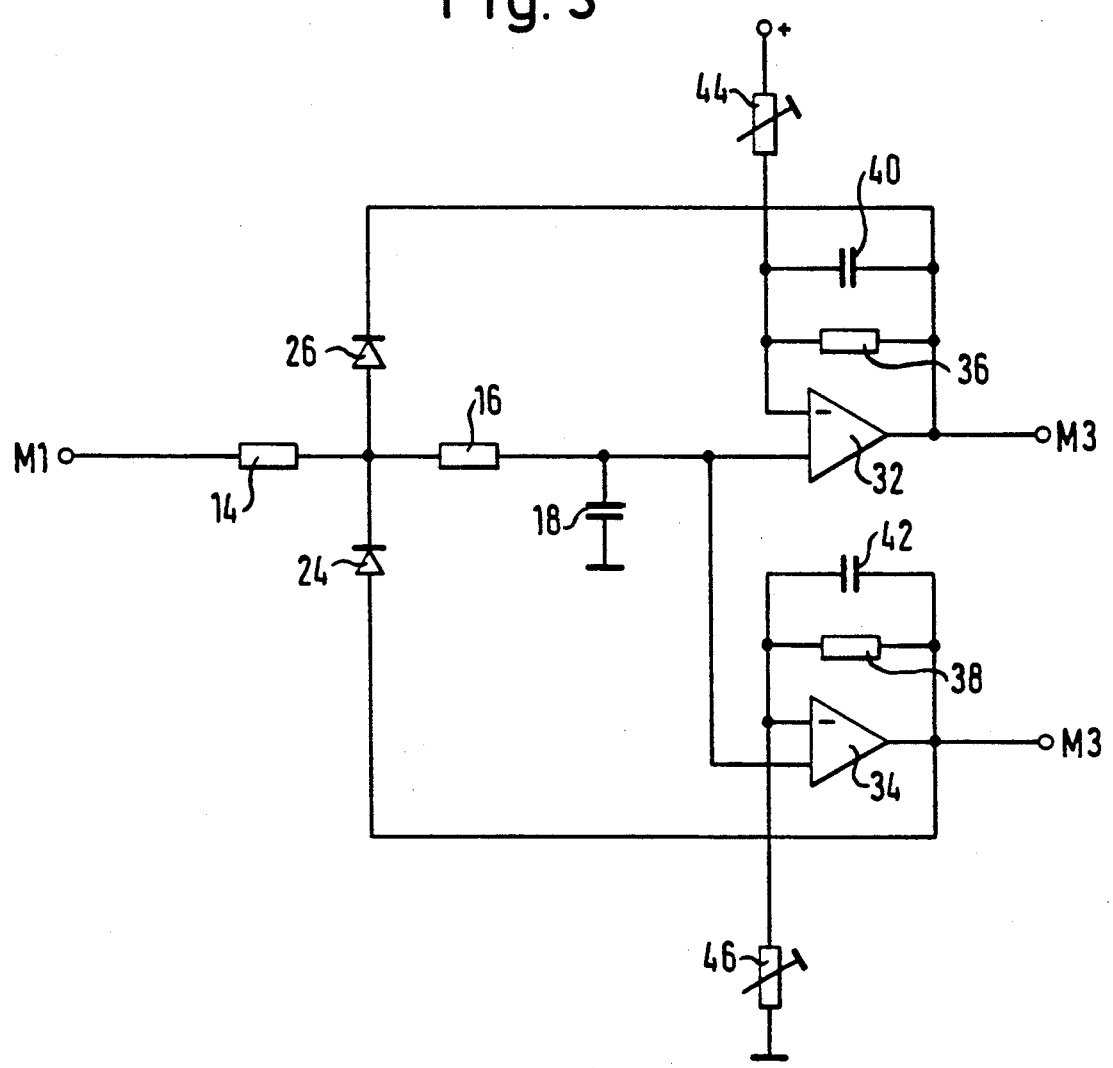

Further features and advantages of the invention will be apparent from the following description and from the drawings, to which reference is made and in which:

FIG. 1 shows a circuit diagram of a first embodiment of the circuit arrangement;

FIGS. 2a, b and c show signal diagrams to explain the mode of operation of the circuit arrangement; and FIG. 3 is a circuit diagram of a second embodiment.

The circuit arrangement shown in FIG. 1 is intended for use in a mobile radio receiver. The multiplex signal taken from behind the demodulator of the receiving section and denoted by M1 is applied to the input 10 of the circuit arrangement. Said signal is shown in FIG. 2a. The signal M1 is amplified in an amplifier 12 set to a gain factor V and supplied to the load resistor 14 of a voltage divider. The load resistor 14 is followed by the resistor 16 of an RC member with integrating behaviour, the capacitor 18 of which is connectable to ground via a switch 20. The non-inverting input of a differential amplifier 22, the output of which is fed back to its inverting input, is connected to the connection point between the resistor 16 and the capacitor 18. The output of the differential amplifier 22 is connected via two diodes 24, 26 connected antiparallel to the connection point between the resistors 14, 16. The diode pair 24, 26 forms a nonlinear element of a voltage divider, the load resistor of which is the resistor 14. The output signal of the differential amplifier 22 acting as impedance converter is tapped off via a potentiometer 28. The adjustment of the potentiometer 28 is carried out synchronously with the variation of the gain factor V of the amplifier 12. The output signal M3 taken from the potentiometer 28 thus has the same level as the input signal M1. Also connected to the input 10 is an interference detector 30 which analyzes the input signal M1 and on occurrence of interferences emits a drive signal for the switch 20 to close the latter temporarily. The interference detector 30 is constructed in known manner and will therefore not be described in detail; it preferably contains filter circuits which respond to certain frequency components in the input signal M1, in particular frequency components characteristic of the occurrence of multipath reception interferences.

Alternatively, the switch 20 is controlled by a field-strength-dependent signal or by the generally available changeover signal for stereo/mono changeover. In a manner different from the embodiment shown in FIG. 1, when using an interference detector 30 the input signal thereof can be formed by the field-strength indicating signal which is generally furnished by IF-IC circuits and on the basis of which a particularly reliable interference signal detection is possible.

The mode of operation of the circuit arrangement will now be described with reference to FIG. 2. The multiplex signal M1 shown in FIG. 2a consists of a fundamental oscillation assumed to be approximately sinusoidal and an interference signal which is superimposed thereon and the frequency of which is several times the frequency of the fundamental oscillation. The interference detector 30 detects the interference signal and effects closure of the switch 20. Between the resistors 14 and 16 the signal M2 shown in FIG. 2b then arises and is formed by the pulses of the interference signal being limited behind the differential amplifier 22 with respect to the instantaneous level of the output signal M3. The limitation is effected in that the diodes 24, 26, from a certain threshold voltage above or below the reference signal taken from the output of the differential amplifier 22, become conductive and cause a voltage drop in the load resistor 14. The limitation is thus effected with respect to a reference signal which is taken from the output of the differential amplifier 22 and corresponds to the output signal M3. When the switch 20 is open no change of the input signal M1 at all takes place because reference signal at the output of the differential amplifier 22 corresponds exactly to the signal M2 between the resistors 14 and 16. As apparent from FIG. 2c, the output signal M3 is largely freed from interference signal components. It is of particular significance that when the limitation method described is used no appreciable widening of the remaining interference signal pulses by the RC member 16, 18 takes place. The frequency of the interference signal components is therefore scarcely reduced so that they remain outside the audible LF range.

As can be seen from FIG. 2b, the interference signal components in the signal M2 lie within a zone above and below the fundamental oscillation which has a width defined by the threshold voltage of the diodes 24, 26. The width of this zone may be varied relatively to the amplitude of the signal M2 by varying the gain factor of the amplifier 12. In this manner, it is easy to define the point beyond which the limitation is to take place.

In the embodiment according to FIG. 3 the multiplex signal M1 is applied directly to the load resistor 14 which is followed by the RC member with the resistor 16 and the capacitor 18. Two differential amplifiers 32, 34 are connected in parallel with their non-inverting input to the connection point between the resistor 16 and capacitor 18. The two differential amplifiers 32, 34 have a feedback to the inverting input via a resistor 36 and 38 and a capacitor 40 and 42 connected in parallel thereto respectively. Furthermore, via an adjustable resistance 44 and 46 a fixed voltage potential is connected to said input, in the case of the resistance 44 a positive potential and in the case of the resistance 46 ground potential. The output of the differential amplifier 32 is connected via a diode 26 to the connection point between the resistors 14 and 16; analogously, the output of the differential amplifier 34 is connected via a diode 24 to the same connection point between the resistors 14, 16. By application of a bias to the inverting inputs of the differential amplifiers 32, 34 their outputs are brought to a dc voltage potential so that a bias potential is applied to the diodes 24, 26. The magnitude of this bias defines the point at which the limitation taking place behind the load resistor 14 starts. This starting point can be adjusted to the desired value by varying the resistances of the resistors 44, 46.

In the embodiment according to FIG. 3 as well the capacitor 18 can be connected via an interrupter. A further embodiment resides in that the capacitor 18 lies in series with a controllable resistor, the resistance of which is controlled by a quality rating signal. In the simplest case, the controllable resistor used is a field-effect transistor, to the gate of which a voltage is applied having a level which is a function of the interference signal component in the multiplex signal M1. For example, the high-frequency signal components are filtered out of the multiplex signal, rectified and smoothed in order to obtain a quality rating signal suitable for driving the gate of the field-effect transistor.

I claim:

1. A circuit arrangement for suppression of interference signals in an electrical signal containing low-frequency information comprising:
   a signal path for said signal;
   an integrating member with a capacitor and a resister provided in said signal path;
   a voltage divider preceding said integrating member; said voltage divider containing a nonlinear element and performing a limitation with respect to a reference signal which corresponds to said signal smoothed by said integrating member; and
   an amplifier preceding said voltage divider and having a gain adapted to a current/voltage characteristic of said non-linear element to optimize interference signal suppression.

2. The circuit arrangement according to claim 1, wherein said nonlinear element comprises two diodes connected in parallel and in opposite directions.

3. The circuit arrangement according to claim 1, wherein said integrating member is followed by an impedance converter and said reference signal is formed by an output signal of said impedance converter.

4. The circuit arrangement according to claim 3 wherein said impedance converter is followed by a voltage divider having a division ratio which is at least approximately equal to the reciprocal of the gain of said amplifier.

5. A circuit arrangement for suppression of interference signals in an electrical signal containing low-frequency information comprising:
   a signal path for said signal;
   an integrating member with a capacitor and a resister provided in said signal path;
   a voltage divider preceding said integrating member; said voltage divider containing a nonlinear element and performing a limitation with respect to a reference signal which corresponds to said signal smoothed by said integrating member; and
   a switch;
   wherein said capacitor of the integrating member can be connected to and disconnected from said resistor via said switch and said switch is controllable by an interference detector which analyzes said signal.

6. The circuit arrangement according to claim 5, wherein said switch has normally open contacts closed only on occurrence of interference pulses.

7. A circuit arrangement for suppression of interference signals in an electrical signal containing low-frequency information comprising:
   a signal path for said signal;
   an integrating member with a capacitor and a resistor provided in said signal path;
   a voltage divider preceding said integrating member; said voltage divider containing a nonlinear element and performing a limitation with respect to a reference signal which corresponds to said signal smoothed by said integrating member; and
   an impedance converter preceding said integrating member, said reference signal being formed by an output signal of said impedance converter and said impedance converter being formed by a differential amplifier, the output of which is fed back to an inverting input thereof and to a non-inverting input of which the output of said integrating member is applied.

8. The circuit arrangement according to claim 7, wherein said differential amplifier has its output connected via at least one diode to the input of said integrating member.

* * * * *